(12) United States Patent
Zampini et al.

(10) Patent No.: US 6,858,379 B2
(45) Date of Patent: Feb. 22, 2005

(54) PHOTORESIST COMPOSITIONS FOR SHORT WAVELENGTH IMAGING

(75) Inventors: Anthony Zampini, Westborough, MA (US); Charles R. Szmanda, Westborough, MA (US); Gary N. Taylor, Northboro, MA (US); James F. Cameron, Cambridge, MA (US); Gerhard Pohlers, Newton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 146 days.

(21) Appl. No.: 10/101,768

(22) Filed: Mar. 20, 2002

(65) Prior Publication Data

US 2003/0027077 A1 Feb. 6, 2003

Related U.S. Application Data

(60) Provisional application No. 60/278,172, filed on Mar. 22, 2001.

(51) Int. Cl.$^7$ ................................................. G03C 5/00
(52) U.S. Cl. .................... 430/325; 430/270.1; 430/326; 430/907
(58) Field of Search ............................ 430/271.1, 907, 430/325, 326, 270.1

(56) References Cited

U.S. PATENT DOCUMENTS 5,738,975 A    4/1998  Nakano et al.
6,468,712 B1 *  10/2002  Fedynyshyn ............. 430/270.1
6,548,219 B2 *  4/2003  Ito et al. .................. 430/270.1

FOREIGN PATENT DOCUMENTS

EP    1 035 441       9/2000
EP    0 880 075       10/2001
WO    WO 00/67072     11/2000

OTHER PUBLICATIONS

Y. Uetani et al., "Effect of Fluorinated Monomer Unit Introduction to KrF resin system in F2 Lithography", Proceedings of the SPIE—The International Society for Optical Engineering, vol. 4345, No. 1, Feb. 2001, pp. 379–384.

* cited by examiner

*Primary Examiner*—Rosemary Ashton
(74) *Attorney, Agent, or Firm*—Peter F. Corless; Darryl P. Prickey; Edwards & Angell, LLP

(57) ABSTRACT

New photoresists are provided that are suitable for short wavelength imaging, including sub-200 nm such as 157 nm. In one aspect, resists of the invention comprise a fluorine-containing polymer, a photoactive component, and one or more additional components of an amine or other basic composition, a dissolution inhibitor compound, a surfactant or leveling agent, or a plasticizer material. In another aspect, resists of the invention contain a fluorine-containing resin and one or more photoacid generator compounds, particularly non-aromatic onium salts and imidosulfonates, and other non-ionic photoacid generator compounds.

8 Claims, No Drawings

PHOTORESIST COMPOSITIONS FOR SHORT WAVELENGTH IMAGING

The present application claims the benefit of U.S. provisional application No. 60/278,172, filed Mar. 22, 2001, which is incorporated herein by reference in its entirety.

BACKGROUND OF THE INVENTION

1. Field of the Invention

The present invention relates to new photoresists that are suitable for short wavelength imaging, including sub-200 nm such as 157 nm. In one aspect, resists of the invention comprise a fluorine-containing polymer, a photoactive component, and one or more additional components of an amine or other basic composition, a dissolution inhibitor compound, a surfactant or leveling agent, or a plasticizer material. In another aspect, resists of the invention contain a fluorine-containing resin and one or more photoacid generator compounds, particularly non-aromatic onium salts and imidosulfonates, and other non-ionic photoacid generator compounds. Preferred resists of the invention also may comprise a blend of two or more resin components, preferably where each blend member is a fluorine-containing resin, and/or a blend of two or more photoacid generator compounds. Preferred resists of the invention are chemically-amplified, positive-acting compositions.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 193 nm. Use of such short exposure wavelengths can enable formation of smaller features. Accordingly, a photoresist that yields well-resolved images upon 248 nm or 193 nm exposure could enable formation of extremely small (e.g. sub-0.25 μm) features that respond to constant industry demands for smaller dimension circuit patterns, e.g. to provide greater circuit density and enhanced device performance.

Quite recently, $F_2$ excimer laser imaging, i.e. radiation having a wavelength of about 157 nm, has been considered as a route to manufacture of even smaller features. See, generally, Kunz et al., SPIE Proceedings (Advances in Resist Technology), vol. 3678, pages 13–23 (1999).

SUMMARY OF THE INVENTION

Novel photoresist compositions are provided that comprise a fluorine-containing polymer, a photoactive component particularly a photoacid generator compound, and one or more additional components selected from the group of an amine or other basic composition, a dissolution inhibitor compound which preferably is a polymeric and/or fluorinated composition, surfactant or leveling agent; and a plasticizer. Preferred resists of the invention also may comprise a blend of two or more resin components, preferably where each blend member is a fluorine-containing resin, and/or a blend of two or more photoacid generator compounds.

In another aspect, photoresist compositions are provided that comprise a fluorine-containing resin and one or more photoacid generator compounds ("PAGs"), particularly non-aromatic onium salts and imidosulfonates, and other non-ionic photoacid generator compounds.

Preferred fluorine-containing polymers of the invention comprise repeat units derived from polymerization of a compound that contains at least one fluorine atom covalently attached to an ethylenically unsaturated atom, e.g. tetrafluoroethylene, chlorotrifluoroethylene, hexafluoropropylene, trifluoroethylene, vinylidene fluoride, vinyl fluoride, and the like. Preferred polymers also may contain units that comprise an alicyclic group such as e.g. a polymerized vinyl adamantyl compound, norbornene, fenchyl, pinnanyl, cyclohexane, and the like.

Resists of the invention may contain a variety of basic components. Such a basic additive can enhance resolution of an image pattern formed with the resist, particularly by inhibiting undesired diffusion of photogenerated acid into unexposed resist layer regions. Preferred basic components are amines, including primary amines, secondary amines, tertiary amines, and quaternary amines.

Preferably, in accordance with the invention, a particular basic additive is selected for incorporation into a resist composition based on the photoacid generator component of the invention. For instance, preferably a sterically hindered amine is used in combination with an iodonium PAG, such as a secondary or tertiary amine that has one or more $C_{4-20}$alkyl or $C_{4-20}$alkoxy substituents, such as DBU. Bases with greater nucleophilicity, such as a carboxylate salt are less preferred for use in combination with an onium salt and other PAGs such as the non-ionic PAGs identified above.

Resists of the invention also may comprise a variety of dissolution inhibitor compounds, which preferably are polymeric and/or fluorinated. Preferred dissolution inhibitor compounds include those that contain a photoacid-labile group, e.g. a photoacid-labile ester or acetal moiety. Lower molecular weight materials also are generally preferred, e.g. polymers or oligomers having an Mw of less than 5,000, more preferably less than about 4,000, 3,000, 2,000, 1,000 or 500. Fluorinated polymers or oligomers are particularly preferred dissolution inhibitor compounds.

Surfactant and leveling agents employed in resists of the invention include e.g. silicon-containing compounds and ionic salts such as an ammonium compound. Silicon-containing compounds are generally preferred surfactant agents.

A variety of plasticizer materials may be employed in resists of the invention. Such materials can inhibit or prevent e.g. undesired crazing or cracking of a deposited resist layer as well as enhance adhesion to an underlying substrate surface or other underlying layer such as an organic or inorganic antireflective composition layer. Preferred plasticizers include e.g. materials having one or more hetero atoms (particularly S or O), and preferably materials having a molecular weight of about 20 to 1000. Exemplary preferred plasticizers include adipates, sebacates, phthlates (although aromatic phthlates less preferred), poly(ethylene glycols); and the like.

Photoresists of the invention preferably comprise one or more photoacid generator compounds (PAGs) as a photoactive component. Preferred PAGs for use in resists of the invention include onium salt compounds including iodonium and sulfonium compounds; and non-ionic PAGs such as imidosulfonate compounds, N-sulfonyloxyimide compounds; diazosulfonyl compounds and other sulfone PAGS including α,α-methylenedisulfones, disulfonehydrazines and disulfonylamine salts; nitrobenzyl compounds, halogenated particularly fluorinated non-ionic PAGS. Preferred PAGs do not have aromatic substitution.

Even more preferred is to employ a mixture of distinct photoacid generator compounds in a single resist formulation. For example, preferred resists of the invention include at least one ionic PAG (e.g., an iodonium or sulfonium compound or other onium salt) and a non-ionic PAG such as those mentioned above. Such PAG blends can enhance lithographic properties of a resist composition.

Photoresists of the invention also may contain a blend of resins, where at least one of the resins is a fluorine-containing polymer. Preferably each member of the resin blend is a fluorine-containing polymer. Also preferred is that at least one member of the blend is a polymer that contains units derived from polymerization of a compound that contains at least one fluorine atom covalently attached to an ethylenically unsaturated atom, e.g. tetrafluoroethylene.

While as mentioned above, positive-acting resists are generally preferred, the invention also includes negative resists. Negative resists of the invention generally include a crosslinker linker, typically as a separate composition component, in addition to a fluorine-containing polymer, a photoactive component, and one or more additional components selected from the group of an amine or other basic composition, a polymeric dissolution inhibitor compound, and a surfactant or leveling agent.

The invention also includes methods for forming relief images, including methods for forming a highly resolved relief image such as a pattern of lines (dense or isolated) where each line has vertical or essentially vertical sidewalls and a line width of about 0.40 microns or less, or even about 0.25, 0.20, 0.15, or 0.10 microns or less. In such methods, preferably a coating layer of a resist of the invention is imaged with short-wavelength radiation, particularly sub-200 nm radiation, especially 157 nm radiation, and higher energy radiation having a wavelength of less than 100 nm, and otherwise high energy radiation such as EUV, electron beam, ion beam or x-ray. The invention further comprises articles of manufacture comprising substrates such as a microelectronic wafer having coated thereon the photoresists and relief images of the invention. Other aspects of the invention are disclosed infra.

DETAILED DESCRIPTION OF THE INVENTION

As discussed above, in a first aspect, resists of the invention comprises a fluorine-containing polymer, a photoactive component particularly a photoacid generator compound, and one or more additional components selected from the group of an amine or other basic composition, a dissolution inhibitor compound which preferably is a polymeric and/or fluorinated composition, a surfactant or leveling agent, and a plasticizer. In another aspect, resists are provided that contain a fluorine-containing resin and one or more photoacid generator compounds, particularly non-aromatic onium salts and imidosulfonates, and other non-ionic photoacid generator compounds.

Resins

The fluorine-containing resin component of a resist of the invention suitably contains a repeat unit derived from at least one ethylenically unsaturated compound. Preferably the unsaturated group is an alicyclic group such as norbornene, cyclohexene, adamantene and the like. The alicylic unsaturated compound preferably has one or more substituents of fluorine, perfluoralkyl particularly $C_{1-12}$perfluoralkyl, or perfluoroalkoxy particularly $C_{1-12}$perfluoralkoxy. Preferably, such a fluorine substituent is separated from the unsaturated carbons by at least one saturated carbon in order to not unduly inhibit the polymerization reaction. Also preferred are fluorinated olefinic compounds such as tetrafluorethylene (TFE) compounds and hexafluoroisopropanol compounds and derivatives thereof. Exemplary preferred unsaturated compounds for synthesis of fluorine-containing polymers of the invention include the following of Formulae (A) through (J):

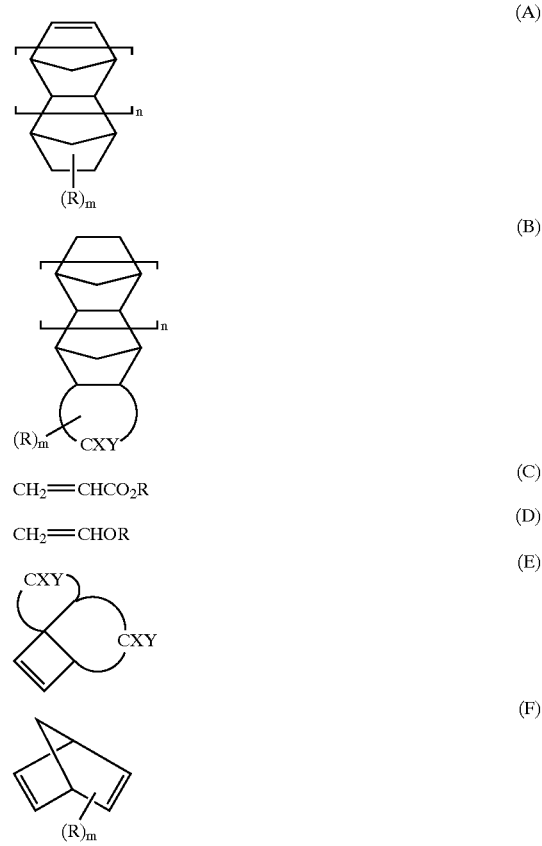

TFE

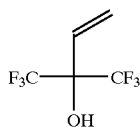

(G)

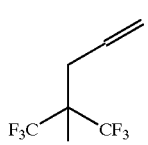

(H)

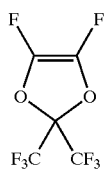

(I)

wherein in those Formulae (A) through (J), each R is independently hydrogen or a non-hydrogen substituent such as a halogen particularly fluoro optionally substituted alkyl such as $C_{1-12}$ alkyl, haloalkyl particularly $C_{1-12}$fluoroalkyl preferably $C_{1-12}$perfluoroalkyl., optionally substituted alkoxy such as $C_{1-12}$ alkoxy, haloalkoxy particularly $C_{1-12}$fluoroalkyl, a carboxyl group, $C_{1-14}$alkylcarboxyl, or a photoacid-labile group such as an photoacid-labile ester or acetal;

m is an integer of 1 to the maximum permitted by the valence of the monomer, and m is typically 1, 2, 3, 4 or 5; and n is 0, 1 or 2. Some of the compounds (A) through (J) are generally described in WO 00/17712, incorporated herein by reference.

Generally preferred monomers of the above formulae, include those of the following Formulae (K) and (L):

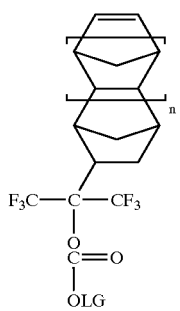

(K)

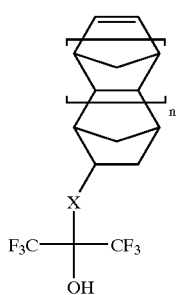

(L)

wherein in those Formulae (K) and (L), X is (—$CH_2$—)$_p$ where p is zero, 1 or 2, preferably 1 or 2, or —$OCH_2$— or —$CH_2O$—; —$CH_2OCH_2$—; or —$CH_2O$—; LG is hydrogen or a component of a photoacid-labile moiety, such as a quaternary carbon e.g. t-butyl or other quaternary carbon of an optionally substituted $C_{4-18}$alkyl; and n is zero or 1.

Generally preferred pendant groups from a monomer (such as groups R in (A) through (F)) incorporated into a resin of a resist of the invention include groups of the following structure:

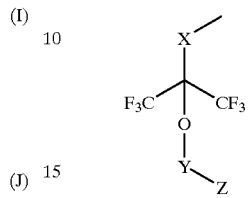

(J)

wherein X is as defined for Formulae (K) and (L) above;

Y is hydrogen, a chemical bond linking the oxygen and group Z, (—$CH_2$—)p where p is 1 or 2, —$CH_2O$—, or CHRO— where R is $C_{1-16}$alkyl, preferably $C_{1-4}$alkyl; and Z is alkyl preferably having 1 to about 20 carbons and including tri($C_{1-16}$)alkylmethyl; di($C_{1-16}$) alkylcarboxylicarylmethyl; benzyl; fenchyl; tri($C_{1-16}$alkyl) carbocyclicaryl; $C_{1-16}$alkylcarbonyloxy; a formyl group; an acetate group such as having 2 to about 20 carbon atoms; tetrahydropyranyl; or tetrahydrofuranyl;

and preferably X is —$OCH_2$—; preferably Y is a bond or —$CH_2O$—; and preferably Z is t-butyl, methyl or fenchyl.

Additional monomers that may be polymerized to provide a fluorine-containing resin of a resist of the invention include those of the following Formulae (M) through O), where starting materials (i.e. (N') and (O')) are shown as well as the polymerized group (i.e. (M"), (N") and O")):

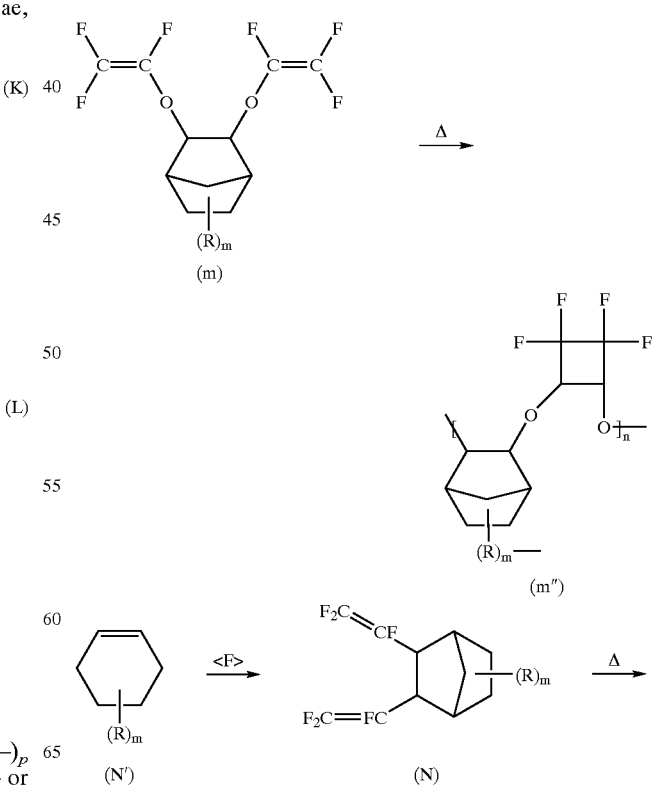

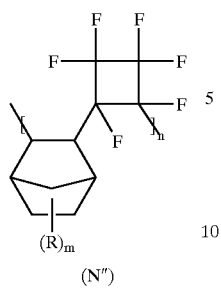
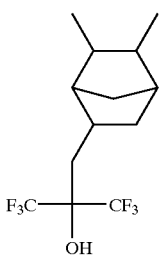

(N")

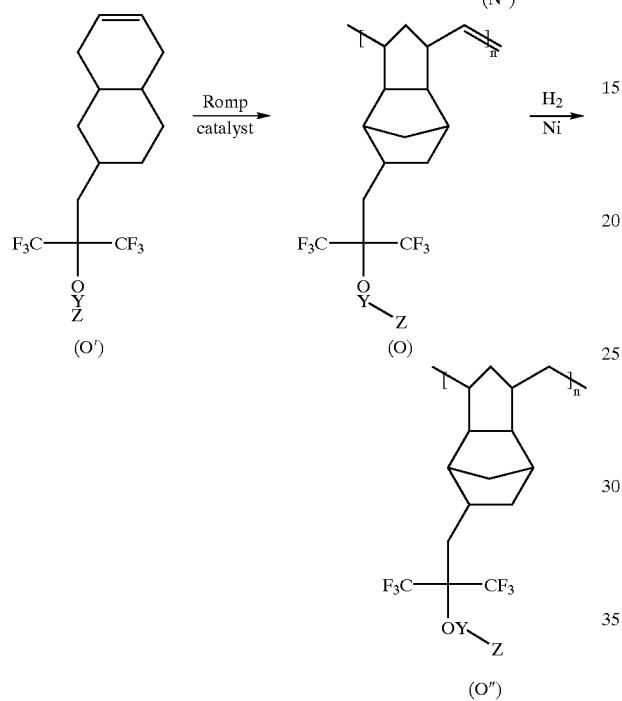

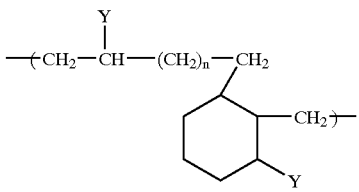

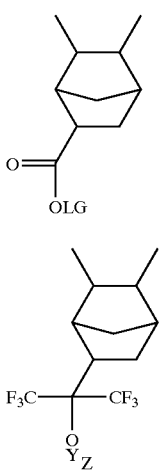

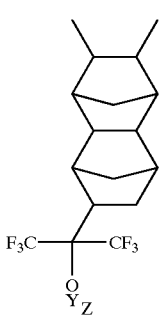

in those structures for M, M", N, N'N", O, O' and O", R and m are the same as defined above for monomers of Formulae (A) through (J); X is (—CH$_2$—)$_p$ where p is zero or 1; —OCH$_2$—; —CH$_2$OCH$_2$—; or —CH$_2$O—;.

Y is a bond, hydrogen, —CH$_2$O—, or —CHRO— where R is C$_{1-16}$alkyl, preferably C$_{1-4}$alkyl; and preferably X is —OCH$_2$—; and preferably Y is a bond or —CH$_2$O—.

Specifically preferred units of a fluorine polymer of a resist of the invention include the units of the following Formulae 1 through 9.

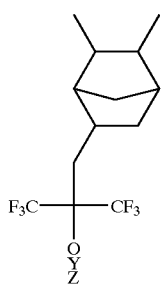

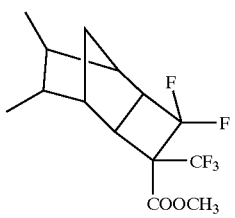

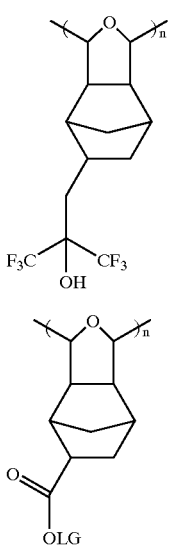

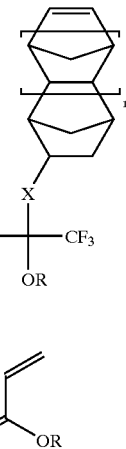

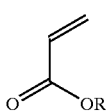

wherein in those structures 1 through 9, LG is hydrogen, $C_{1-12}$ alkyl or a component of a photoacid-labile moiety, such as a quaternary carbon (e.g. t-butyl); and Y and Z are the same as defined above, i.e. Y is hydrogen, a chemical bond linking the oxygen and group Z, ($-CH_2-$)$_p$ where p is 1 or 2, $-CH_2O-$, or CHRO— where R is $C_{1-16}$alkyl, preferably $C_{1-4}$alkyl; and Z is alkyl preferably having 1 to about 20 carbons and including tri($C_{1-16}$)alkylmethyl; di($C_{1-16}$) alkylcarboxylicarylmethyl; benzyl; fenchyl; tri($C_{1-16}$alkyl) carbocyclicaryl; $C_{1-16}$alkylcarbonyloxy; a formyl group; an acetate group such as having 2 to about 20 carbon atoms; tertrahydropyranyl; or tetrahydrofuranyl;

and preferably X is $-OCH_2-$; preferably Y is a bond or $-CH_2O-$; and preferably Z is t-butyl, methyl or fenchyl. In the above structures, the lines extended from the norbornyl ring indicate the polymer backbone or linkage thereto.

Particularly preferred fluorine-containing polymers for use in resists of the invention include resins that comprise repeat units selected from the following group of monomers of Formulae (P), (Q), (R) and (S):

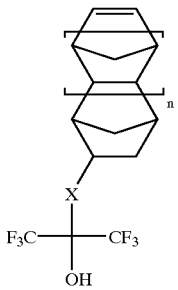

wherein in those Formulae (P), (Q), (R) and (S), R is hydrogen or optionally substituted alkyl, such as $C_{1-12}$alkyl, particularly methyl, ethyl, propyl, butyl including t-butyl, and the like; and X is as defined above X is ($-CH_2-$)$_p$ where p is zero, 1 or 2, preferably 1 or 2, or $-OCH_2-$ or $-CH_2O-$.

Preferred polymers for use in resists of the invention include those that contain units of 1) (P) and (Q) in combination; 2) (P), (Q') and (R) in combination; and 3) (P) and/or (Q'), (R) and (S) in combination.

Particularly preferred polymers for use in resists of the invention include:

(1) resins consisting of units of (P) and (Q) where (P):(Q') are present in a respective molar ratio of approximately: 50:50; 60:40; 70:30; 80:20; 90:10; 40:60; 30:70; 20:80; or 10:90;

(2) resins consisting of units of (P), (Q) and (R), where (P) is present at about 10 to 60 mole percent based on total units of the polymer, preferably 20 to 50 or 30 to 40 mole percent based on total units of the polymer, (Q) is present at about 1 to 50 mole percent based on total units of the polymer, preferably 5 to 50 or 10 to 40 mole percent based on total units of the polymer; and (R) is present at about 20 to 60 mole percent based on total units of the polymer, preferably 20 to 60 or 30 to 50 or 60 mole percent based on total units of the polymer; and (3) resins consisting of units of (P) and/or (Q), (R) and (S), where (P) and (Q) are each independently present at about 0 to 60 mole percent based on total units of the polymer, preferably 10 to 50 or 20 to 40 mole percent based on total units of the polymer, provided that at least one of (P) and (Q) are present in the polymer; (R) is present at about 50 to 60 mole percent based on total units of the polymer, preferably 10 to 60 or 10 to 30, 40 or 50 mole percent based on total units of the polymer; and (S) is present at about 10 to 60 mole percent based on total units of the polymer, preferably 10 or 20 to 50 or 60 mole percent based on total units of the polymer.

The fluorine-containing polymer of a resist of the invention suitably does not contain aromatic units such as phenyl, naphthyl or pyridyl.

As discussed above, a fluorine-containing polymer may be present with one or more other resins in a resist composition. Those additional resin(s) may or may not contain fluorine and typically do not contain aromatic units.

The resin component of a resist composition of the invention should be present in an amount sufficient to providing acceptable film-forming characteristics. See the example which follows for preferred amounts of a resin component.

Photoactive Component

A variety of photoactive components may be employed in resists of the invention. Photoacid generators (PAGs) are generally preferred. Particularly preferred PAGs for use in resists of the invention include include onium salt compounds including iodonium and sulfonium compounds; and non-ionic PAGs such as imidosulfonate compounds, N-sulfonyloxyimide compounds; diazosulfonyl compounds and other sulfone PAGS including α,α-methylenedisulfones and disulfonehydrazines, nitrobenzyl compounds, halogenated particularly fluorinated non-ionic PAGS. Preferred PAGs do not have aromatic substitution.

More specifically, preferred iodonium PAGs include those of the following Formula I:

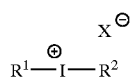

wherein in Formula I, $R^1$ and $R^2$ are each independently optionally substituted alkyl such as $C_{1-20}$alkyl including alicyclics such as cyclohexyl, adamantly, isobornyl, norbornyl, fencyl, dodecanyl, and the like; optionally substituted carbocyclic aryl such as phenyl, naphthyl and the like; and optionally substituted heteroaromatic or heteroalicyclic such as groups having 1 to 3 separate or fused rings and 1-3 hetero atoms (N, O or S) as ring members; and X is a counter anion such as a carboxylate or sulfonate counter anion, preferably a a sulfonate ($-SO_3^-$) or carboxylate($-COO^-$) substituted with one or more moieties such as optionally substituted alkyl preferably $C_{1-20}$alkyl, particularly $C_{1-10}$alkyl substituted with one or more electron-withdrawing groups e.g. F or other halo, nitro, cyano, etc., with perfluoruoalkyl, particularly $C_{1-10}$perfluoroalkyl being preferred; optionally substituted carbocylic aryl such as phenyl or naphthyl; optionally substituted heteroaromatic or heteroalicyclic such as groups having 1 to 3 separate or fused rings and 1–3 hetero atoms (N, O or S) as ring members.

Preferred imidosulfonate PAGs include compounds of the following Formula II:

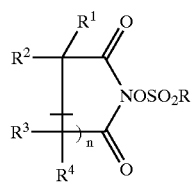

wherein in Formula II, R is suitably by optionally substituted alkyl preferably $C_{1-20}$alkyl, particularly $C_{1-10}$alkyl substituted with one or more electron-withdrawing groups e.g. F or other halo, nitro, cyano, etc., with perfluoruoalkyl, particularly $C_{1-10}$perfluoroalkyl being preferred; optionally substituted carbocylic aryl such as phenyl or naphthyl; optionally substituted heteroaromatic or heteroalicyclic such as groups having 1 to 3 separate or fused rings and 1–3 hetero atoms (N, O or S) as ring members;

$R^1$, $R^2$, $R^3$ and $R^4$ each independently being hydrogen or a group as defined for R, or where $R^2$ and $R^3$ are taken together and/or $R^1$ and $R^4$ are taken together to form a ring, preferably an alicyclic ring, e.g. having from 4 to about 8 ring members; and n is 1, 2, 3 or 4, preferably 1 or 2.

Preferred PAGs of Formula II include those with a fused alicyclic ring structure, such as PAGs of the following Formula IIa:

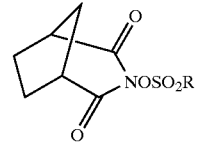

wherein in Formula IIa, R, $R^1$, $R^2$, $R^3$ and $R^4$ are each the same as defined in Formula II above, with one (and preferably all) of $R^1$, $R^2$, $R^3$ and $R^4$ suitably being hydrogen is the same as defined in Formula II above; and X is methylene ($-CH_2-$), O or S. Particularly preferred PAGs of Formula IIa include those where X is methylene and R is fluorinated $C_{1-12}$alkyl, particularly perfluoro$C_{1-12}$alkyl such as $-CF_3$.

Sulfonium PAGS also will be suitable for use in resists of the invention, although perhaps less preferred than the iodonium salts and imidosulfonate compounds. For instance, preferred sulfonium PAGs include compounds of the following Formula III:

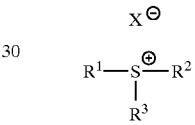

wherein $R^1$, $R^2$ and $R^3$ are each independently selected from the same group as defined for $R^1$ and $R^2$ in Formula I above; and X is the same as defined for Formula I above.

Also preferred are ring sulfonium PAGs such as those of the following Formula IV:

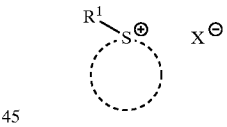

wherein R1 and X are the same as defined in Formula III above; the dotted lines designate a ring structure that includes the depicted sulfur cation as a ring member, the ring suitably having 5 to about 8 ring members, and one, two or more endocyclic multiple bonds, and one or more optional ring substituents. Preferably the dotted lines form a non-aromatic ring, such as thienyl, or a completely saturated ring (no endocyclic double bonds).

In the above Formulae I, III and IV, preferred counter anions X are perfluoroalkyl and perfluoroalkoxy groups such as $C_{1-15}$perfluoroalkyl and $C_{1-15}$Perfluoroalkoxy, e.g. triflate, perfluorobutanesulfonate, perfluorohexanesulfonate, perfluoroctanesulfonate, and perfluoroethoxyethylsulfonate.

A variety of other PAGs may be used in resists of the invention, including non-ionic PAGs such as substituted disulfone compounds; sulfonate compounds including N-oxyimino sulfonate compounds, α-cyano N-oxyimino sulfonate compounds; sidulfone hydrazine compounds; diazomethanedisulfone compounds; nitrobenzyl compounds; substituted acylsulfonoium compounds; and oxime sulfonate compounds including bis-N-oxyimidosulfonate compounds.

More particularly, preferred disulfone PAGs for use in resists of the invention include compounds of the following Formula V:

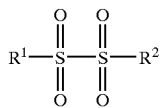
V wherein $R^1$ and $R^2$ are the same as defined for Formula I above.

Preferred oxime sulfonate PAGs for use in resists of the invention include those of the following Formula VI:

$$R^1R^2C\!\!=\!\!NOS(O)_2Y \qquad \qquad VI$$

wherein $R^1$ and $R^2$ may be the same as defined above for Formula I, and/or where at least one of $R^1$ and $R^2$ is an electron-withdrawing moiety such as cyano, nitro, haloalkyl particularly $C_{1-12}$haloalkyl especially $C_{1-12}$perfluoroalkyl such as —$CF_3$, —$CF_2CF_3$ and other perfluoroalkyl, alkanoyl, and the like;

Y is a non-hydrogen substituent and is suitably the same as defined for R in Formula II above.

Preferred diazosulfone PAGS for use in resists of the invention include those of the following Formula VII:

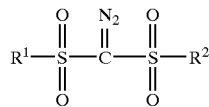
VII wherein $R^1$ and $R^2$ are the same as defined in Formula I above.

Preferred α,α-methylenedisulfone PAGs for use in resists of the invention include those of the following Formula VIII:

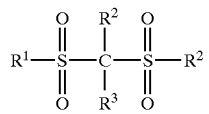
VIII wherein $R^1$ and $R^2$ are the same or different and are other than hydrogen and are suitably the same as defined above in Formula I;

$R^3$ and $R^4$ are the same or different and may be hydrogen or a non-hydrogen substituent such as defined for $R^1$ in Formula I above, and preferably at least one of $R^3$ and $R^4$ is other than hydrogen, more preferably both $R^3$ and $R^4$ are other than hydrogen.

As mentioned above, disulfonehydrazine PAGS (i.e. hydrazine moiety interposed between the two sulfone moieties) also are suitable, preferably where the hydrazine moiety (e.g. —$N(R^3)$—$N(R^4)$— of Formula IX below) interposed between the two sulfone moieties is mono- or di-substituted with non-hydrogen substituents. Preferred disulfonehydrazine PAGs for use in resits of the invention include compounds of the following Formula IX:

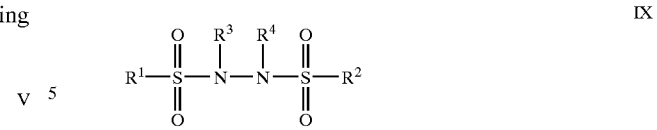
IX wherein $R^1$ and $R^2$ are the same or different and are other than hydrogen, and suitably are the same as defined in Formula I;

$R^3$ and $R^4$ are the same or different and may be hydrogen or a non-hydrogen substituent such as defined for $R^1$ in Formula I above, and preferably at least one of $R^3$ and $R^4$ is other than hydrogen, more preferably both $R^3$ and $R^4$ are other than hydrogen.

Further suitable PAGs for use in resists of the invention include disulfonylamine (i.e. —$SO_2$—N—$SO_2$—) salts, such as compounds of the following Formula X:

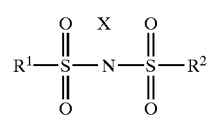
X wherein $R^1$ and $R^2$ are the same or different and are other than hydrogen, and suitably are the same as defined in Formula I; and X is a counter ion.

One or more PAGS should be employed in a resist in an amount sufficient to provide a developable image upon exposure to activating radiation, such as 157 nm radiation. Suitably one or more PAGs are employed in an amount of 1 to 15 weight percent based on total solids of the resist (all components except solvent), more typically about 2 to 12 weight percent of total solids.

PAGs for use in resists of the invention can be made by generally known procedures. For instance, see U.S. Pat. Nos. 4,442,197 and 4,642,912 and European Application 0708368A1 for synthesis of iodonium PAGS. See WO 94/10608 for synthesis of N-sulfonyloxyimide PAGs. Diazosulfone PAGs can be made, e.g., by procedures disclosed in European Patent Application 0708368A1 and U.S. Pat. No. 5,558,976. See also WO 00/10056.

Basic Additive

As discussed above, resists of the invention may suitably comprise a basic additive. The basic additive can be used in relatively small amount (e.g. 0.1 to 1, 2 or about 3 weight percent of the photoactive component) and can significantly enhance lithographic performance, particularly resolution of a developed resist relief image. In particular, addition of an appropriate basic compound to a resist of the invention can effectively suppress undesired photoacid diffusion into masked areas following an exposure step.

Preferred basic additives are amine compounds, including primary, secondary, tertiary and quaternary amines. Amines that are not highly nucleophilic are generally preferred to avoid undesired reaction of the base additive with other resist composition components such as the PAG and/or solvent.

More particularly, secondary and tertiary amines are generally preferred, particularly secondary and tertiary amines that have sterically large substituents, such as optionally substituted alkyl having at least 3 or 4 carbons e.g. optionally substituted $C_{3-20}$alkyl; optionally substituted alkyl having at least 3 or 4 carbons e.g. optionally substituted $C_{3-20}$alkyl including alicyclic groups such as optionally substituted cyclohexyl, adamantly, isobornyl, etc.; optionally substituted alkenyl having at least 3 or 4 carbons e.g. optionally substituted $C_{3-20}$alkenyl; optionally substituted alkynyl having at least 3 or 4 carbons e.g. $C_{3-20}$alkynyl; optionally substituted carbocyclic ayl such as phenyl; optionally substituted heteroaryl or heroalicyclic such as heteroaryl or heteroalicyclic groups having 1 to 3 separate or fused rings with 1 to 3 hetero atoms (particularly N, O or S) per ring.

Specifically preferred basic additives for use in resist compositions of the invention include DBU (1,8-diazobicyclo[5.4.0]undec-7-ene); DBN (1,5-diazabicyclo[4.3.0]non-5-ene; N,N-bis-(2-hydroxyethyl)piperazine; N,N-bis-(2-hydroxyethyl)-2,5-diazobicyclo[2.2.1]heptane; N-triisopropanolamine; dibutyl amine preferably branched isomers thereof such as diisobutylamine and ditertbutylamine; tributyl amine and again branched isomers thereof such as ditertbuylamine and tritertbutylamine; and the like. Optionally substituted piperidine and other optionally piperazine compounds also will be suitable, particularly hydroxy-substituted or $C_{1-12}$alcohol-substituted piperidines and piperazines, such as N-ethanol piperidine and N-diethanol piperazine. Other basic compounds also are suitable, particularly having one or more nitrogen ring members and 5 to about 8 total ring members.

Other preferred base additives include hydroxy-alkyl secondary and teriarty amines, e.g. secondary and tertiary amines having at least one N-substituent of $C_{2-20}$alkyl having one, two three or more hydroxy moieties, typically one or two hydroxy moieties; alicyclic amines where at least one secondary or tertiary nitrogen is at the junction or bridgehead of a bicyclic or multicyclic compound. Pyridyl compounds also will be suitable such as di-butyl pyridine and polymers thereof such as poly(vinylpyridine). In general, polymeric basic additives will be suitable, e.g. substituted amines having a molecular weight of up to about 200, 300, 400, 500, 600, 700, 800, 900, 1000, 1100, 1200, 1300, 1400 or 1500.

In a particular resist system, the basic additive should be substantially non-interfering with the photoactive component, i.e. not reactive with a PAG during typical storage of a resist. In particular, a base additive is preferably selected to avoid undesired degradation of the photoacid generator during storage of a resist composition, e.g. 2, 3, 4, 5 or 6 months at room temperature (ca. 25° C.) or reduced temperature such as refrigerated conditions (e.g., ca. 5, 10, 15 or 18° C.). More specifically, for resists that contain a dicarboxylate imide PAG (such as depicted in Formulae II and IIA above), or an iodonim compound such as those PAGs of Formula I above, preferably secondary or tertiary amines are employed, particularly hindered secondary or tertiary amines, such as moncyclic, bicylic and tricylic amines where nitrogen is a ring member e.g. DBU, DBN, alkylated pyridines e.g. pyridine substituted with one or more $C_{1-18}$alkyl groups, optionally substitute quinolines, optionally substituted piperidines, optionally substituted pyrazines, and the like. In addition to alicyclic base adidttive with nitrogen ring members, also preferred for use in combination with imidosulfonate and iodonium PAGs are non-cyclic secondary and tertiary amines having one or more alkyl substituents with at least about 4 carbon atoms. Hindered secondary and tertiary amines substituted with one or more alkyl groups, such as $C_{1-20}$alkyl groups, also are preferred for use with an iodonium PAG.

Carboxylate additives (e.g. a carboxylate salt such as a ammonium carboxylate salt) are much less preferred for use with a dicarboxylate imide. Carboxylate additives are also less preferred with an iodonium PAG.

The basic additive is suitably employed in a resist composition is an amount of 0.01 to 5 weight percent based on total solids of the resist (all components except solvent), more preferably about 0.05 to 2 weight percent of total solids.

Dissolution Inhibitor Compounds

Preferred dissolution inhibitor compounds of resists of the invention are polymeric and/or comprise fluorine substitution. As discussed above, preferred dissolution inhibitor compounds include those that contain a photoacid-labile group, e.g. a photoacid-labile ester or acetal moiety. Lower molecular weight materials also are generally preferred, e.g. polymers or oligomers having an Mw of less than 5,000, more preferably less than about 4,000, 3,000, 2,000, 1,000 or 500. Fluorinated polymers or oligomers are particularly preferred dissolution inhibitor compounds.

The dissolution inhibitor also need not be polymeric (i.e. contain repeat units). For example, a variety of non-polymeric compositions are suitable dissolution inhibitors for resists of the invention, particularly where those materials are fluorinated. For instance, suitable are fluorinated compounds having one or more separate or fused rings, including fluorinated steroidal compounds, e.g. a fluorinated cholates and lithocholates such as cholic acid, deoxycholic acid, lithocholic acid, t-butyl deoxycholate, t-butyl lithocholate, and the like. Fluoirnated steroidal compounds may be suitably preferred by fluorination of a known steroid, where a carbonyl group is modified to a difluromethylene. Such non-polymeric compounds also may have one photoacid-labile groups, e.g. a photoacid-labile ester or acetal moiety.

One or more dissolution inhibitor compounds may be suitably present in a resist composition in an amount of from about 0.001 to 5 or more weight percent based on total solids (all components except solvent), more preferably 0.001 to 1 weight percent of total solids of a resist.

Surfactants and Levelers

Surfactant and leveling agents employed in resists of the invention include e.g. silicon-containing compounds and ionic salts such as an ammonium compound. Silicon-containing compounds are generally preferred surfactant agents. Exemplary preferred surfactants and levelers include Silwet 7604 (siloxane copolymer available from Union Carbide); FC-430 (an imidosulfoante, available from 3M); RO8 (mixture containing a fluoroalcohol); Modaflow (an acrylate material). Surfactants and levelers may be suitably employed in amounts as disclosed above for dissolution inhibitor compounds.

Plasticizer Compounds

As discussed above, resists of the invention also may contain one or more plasticizer materials, which can inhibit or prevent undesired crazing or cracking of a deposited resist layer as well as enhance adhesion of the resist layer to an underlying material. Preferred plasticizers include e.g. materials having one or more hetero atoms (particularly S or O), and preferably materials having a molecular weight of about 20 to 1000, more typically about 20 to about 50, 60, 70, 80, 90, 100, 150, 200, 250, 300, 400 or 500, e.g. adipates, sebacates and phthalates such as bis(2-butoxyethyl)adipate; bis(2-butoxyethyl)sebacate; bis-(2-butoxyethyl)phthalate; 2-butoxyethyl oleate; diisodecyl adipate; diisodecyl glutarate; and poly(ethylene glycols) such as poly(ethyleneglycol)acrylate, poly(ethylene glycol)bis(2-ethylhexanoate), poly(ethylene glycol)dibenzoate, poly(ethylene glycol)dioleate, poly(ethylene glycol)monooleate, tri(ethylene glycol)bis(2-ethylhexanoate), and the like.

One or more plasticizer compounds may be suitably present in a resist composition in an amount of from about 0.5 to 10 or more weight percent based on total solids (all components except solvent), more preferably 0.5 to 3 weight percent of total solids of a resist.

As discussed, various moieties of PAGs, base additives and resin units, and other components of resists of the invention may be optionally substituted, typically 1, 2, or 3 positions by one or more suitable groups such as e.g. halogen (particularly F, Cl or Br); $C_{1-8}$alkyl; $C_{1-8}$alkoxy; $C_{2-8}$alkenyl; $C_{2-8}$alkynyl; hydroxyl; alkanoyl such as a $C_{1-6}$alkanoyl e.g. acyl; carobcyclic aryl such as phenyl; and the like, although multiple carbon-carbon bonds and aromatic groups will be less preferred due to excessive absorbance of exposure radiation.

Preferred substitution groups will generally include or consist of at least one halogen atom, preferably fluorine such as fluorinated $C_{1-12}$alkyl, perfluoro$C_{1-12}$alkyl, and perfluoro$C_{1-12}$alkylene, fluorinated $C_{3-8}$cycloalkyl, and fluorinated ethers (including $C_{1-12}$alkoxy) and esters (including $C_{1-12}$esters) including fluorinated cyclic ethers and fluorinated cyclic esters.

As used herein, the tern alkyl, alkenyl and alkynyl unless otherwise modified refers to both cyclic groups, although of course cyclic groups will comprise at least three carbon ring members. Alkoxy groups of resist components suitably have 1 to about 16 carbons and 1, 2, 3 or 4 alkoxy linkages. Suitable alkanoyl groups have 1 to about 16 carbons and one or more carbonyl groups, typically 1, 2 or 3 carbonyl groups. Carbocyclic aryl as used herein refers to non-hetero aromatic groups that have 1 to 3 separate or fused rings and 6 to about 18 carbon ring members and may include phenyl, naphthyl, biphenyl, acenaphthyl, phenanthracyl and the like. Phenyl and naphthyl are often preferred. Suitable heteroaromatic or heteroaryl groups will have 1 to 3 rings, 3 to 8 ring members in each ring and from 1 to about 3 hetero atoms (N, O or S). Specifically suitable heteroaromatic or heteroaryl groups include e.g. courmarinyl, quinolinyl, pyridyl, pyrimdinyl, furyl, pyrrolyl, thienyl, thiazolyl, oxazolyl, imidazolyl, indolyl, benzofuranyl and benzothiazole.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate, 2-heptanone and cyclohexanone. 2-heptanonone and slvent blends thereof are generally preferred. A solvent blend for use in a resist of the invention preferably contains about 30, 40, 50, 60, 70, 80, or 90 volume percent of 2-heptanone or cyclohexanone, preferably 2-heptanone. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the example which follows for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm ad sub-170 nm exposure wavelength, particularly 157 nm is a particularly preferred exposure wavelength. However, the resist compositions of the invention also may be suitably imaged at higher wavelengths. For example, a resin of the invention can be formulated with an appropriate PAG and a sensitizer if needed and imaged at higher wavelengths such as about 193 nm or 248 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. Plasma development also may be employed. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting example is illustrative of the invention.

EXAMPLE 1

Preparation of a Resist of the Invention

A resist of the invention is prepared by admixing the following components where amounts are expressed as weight percent of solids (all components except solvent) and the resist is formulated as a 90 percent fluid formulation:

| Component | Amount |
|---|---|
| Resist | balance |
| PAG | 5 |
| Basic Additive | 0.5 |
| Dissolution inhibitor | 10 |
| Surfactant | 0.2 |
| Plasticizer | 0.6 |
| Solvent | to 90 percent formulation |

In the resist, the resin is a fluorine-containing terpolymer consisting of norbornene; t-butylacrylate and tetrefluorethylene (TFE) units prepared by free radical polymerization of the monomers; the PAG is a compound of the Formula IIa above where X is methylene and R is —$CF_3$; the basic additive is DBU; the dissolution inhibitor is fluorinated cholic acid; the surfactant is Silwet 7604; the plasticizer is poly(ethylene glycol)dioleate; and the solvent is 2-heptanone.

The formulated resist composition is spin coated onto HMDS vapor primed 4 inch silicon wafers and softbaked via a vacuum hotplate at 90° C. for 60 seconds. The resist coating layer is exposed through a photomask at 157 nm, and then the exposed coating layers are post-exposure baked at 110° C. The coated wafers are then treated with 0.26N aqueous tetramethylammonium hydroxide solution to develop the imaged resist layer and provide a relief image.

The foregoing description of the invention is merely illustrative thereof, and it is understood that variations and modifications can be effected without departing from the spirit or scope of the invention as set forth in the following claims.

What is claimed is:

1. A method for forming a photoresist relief image comprising:

a) providing a photoresist composition by admixing a fluorine-containing resin, one or more photoacid generator compounds and a basic additive, the basic base additive selected to minimize degradation of the one or more photoacid generator compounds during storage of the photoresist composition;

b) applying a coating layer of the photoresist composition on a substrate;

c) exposing the photoresist coating layer to patterned activating radiation and developing the exposed photoresist layer.

2. The method of claim 1 wherein the basic additive is an alicyclic amine and the one or more photoacid generator compounds are chosen from among imidosulfonate compound and an iodonium compound.

3. The method of claim 1 wherein the radiation has a wavelength of less than 200 nm.

4. The method of claim 1 wherein the photoresist composition compounds one or more chosen from among a dissolution inhibitor compound, surfactant and a plasticizer.

5. A photoresist composition comprising a fluorinated resin, one or more photoacid generator compounds and a basic additive chosen from among 1,8-diazobicyclo[5.4.0]undec-7-ene, 1,5-diazabicyclo[4.3.0]non-5-ene, N,N-bis-(2-hydroxyethyl)piperazine; N,N-bis-(2-hydroxyethyl)-2,5-diazobicylo[2.2.1]heptane, N-triisopropanolamine; dibutyl amine, tributylamine; optionally substituted piperidine; and optionally substituted piperazone.

6. A photoresist composition comprising a fluorinated resin, one or more photoacid generator compounds and a polymeric amine.

7. A photoresist composition comprising a fluorinated resin, one or more photoacid generator compounds and a fluorinated dissolution inhibitor that is a steriod.

8. A photoresist composition comprising a fluorinated resin, one or more photoacid generator compounds and a polymeric dissolution inhibitor.

* * * * *